United States Patent [19]
Vogel et al.

[11] Patent Number: 5,631,178
[45] Date of Patent: May 20, 1997

[54] METHOD FOR FORMING A STABLE SEMICONDUCTOR DEVICE HAVING AN ARSENIC DOPED ROM PORTION

[75] Inventors: John S. Vogel, Gilbert; Ramesh V. Joshi, Mesa; Anand M. Tulpule, Gilbert, all of Ariz.

[73] Assignee: Motorola, Inc., Schaumburg, Ill.

[21] Appl. No.: 381,387

[22] Filed: Jan. 31, 1995

[51] Int. Cl.⁶ .................. H01L 21/265; H01L 21/70; H01L 27/00
[52] U.S. Cl. .................. 438/200; 438/201; 438/258; 438/585; 438/301; 438/719
[58] Field of Search .................. 437/43, 56, 57, 437/58, 59, 48, 52

[56] References Cited

U.S. PATENT DOCUMENTS

| | | | |
|---|---|---|---|
| 4,683,641 | 8/1987 | Ravindhran et al. | 437/41 |
| 4,851,361 | 7/1989 | Schumann et al. | 437/57 |
| 5,094,967 | 3/1992 | Shinada et al. | 437/43 |
| 5,317,534 | 5/1994 | Choi et al. | 365/189.01 |
| 5,367,149 | 11/1994 | Takahira | 235/380 |
| 5,375,083 | 12/1994 | Yamaguchi | 365/900 |
| 5,407,853 | 4/1995 | Komori et al. | 437/52 |

OTHER PUBLICATIONS

Steven J. Fonash, An Overview of Dry Etching Damage and Contamination Effects, Dec. 1990, J. Electrochem. Soc., vol. 137, No. 12, pp. 3885–3892.

Damon DeBusk, SPV Testing—A Real-Time Contamination Monitoring Technique, Apr. 1993, Semiconductor International, pp. 66–68.

*Primary Examiner*—John Niebling
*Assistant Examiner*—Brian K. Dutton
*Attorney, Agent, or Firm*—Kevin B. Jackson

[57] ABSTRACT

A method for making stable arsenic doped semiconductor devices (11,53,56) using dry etching techniques includes forming a polycrystalline semiconductor layer (29) on a upper surface of a semiconductor substrate (12), and patterning the polycrystalline semiconductor layer (29) using a dry etch process such as a plasma etch process. The semiconductor substrate (12) is then exposed to an elevated temperature to substantially reduce any defects contiguous with the upper surface of semiconductor substrate (12) resulting from the dry etch process. Arsenic is then incorporated into the semiconductor substrate (12) to form N+ regions (44). Surface sensitive devices such as MOSFET devices (53,56) are then formed on or within the semiconductor substrate (12).

19 Claims, 8 Drawing Sheets

METHOD FOR FORMING A STABLE SEMICONDUCTOR DEVICE HAVING AN ARSENIC DOPED ROM PORTION

BACKGROUND OF THE INVENTION

This invention relates, in general, to semiconductor processing, and in particular, to semiconductor processes using dry etching and arsenic doping techniques.

Dry etching techniques including reactive ion etching (RIE), magnetron reactive ion etching (MRIE), plasma etching (PE), ion beam etching (IBE), electron cyclotron resonance (ECR) etching and, reactive ion beam etching (RIBE) are well known in the semiconductor industry. Dry etching is an important process for pattern transfer during the manufacture of integrated circuit devices.

Dry etching techniques can have a detrimental effect on a material being etched, on subsequent processing steps, and ultimately on integrated circuit device performance. These detrimental effects include residue layers, impurity and hydrogen permeation layers, bonding damage layers, surface roughening, and charge build-up damage. Known techniques for reducing impurity permeation layers such as Fe, Ni, Al, Na, Cr, K, and/or Zn impurity permeation layers include eliminating impurity sources and post-etch cleaning techniques. Annealing is a known technique for reducing bonding damage layers.

Field-effect transistor (FET) devices including metal oxide semiconductor FET (MOSFET) devices are also well known. Threshold voltage is an important electrical parameter of MOSFET devices that is often affected by processing problems associated with device fabrication. In general, the threshold voltage is a minimum gate voltage required before conduction occurs between a source electrode and a drain electrode. MOSFET based integrated circuit devices such as electrically erasable programmable read-only memory (EEPROM) devices utilize dry etching techniques at various stages of manufacture. In smaller geometry EEPROM devices, it is desirable to use arsenic as one dopant species in device fabrication because, among other things, arsenic diffuses at a slower rate than phosphorous. However, when dry etching techniques are used with arsenic doped devices such as smaller geometry EEPROM devices, significant shifts can occur in the threshold voltage parameter. Thus, a need exists for a method for reducing threshold voltage shifts in arsenic doped devices where dry etching techniques are used.

DETAILED DESCRIPTION OF THE DRAWINGS

Generally, the present invention relates to a method for forming arsenic doped semiconductor integrated circuit devices employing surface sensitive devices and requiring stable electrical characteristics. In particular, the method relates to semiconductor device fabrication processes that utilize dry etching techniques (e.g., plasma etching) and arsenic doping. The method is suitable for semiconductor device structures including MOSFET device structures that are sensitive to surface effects such as charge effects and/or damage.

Figure 1:
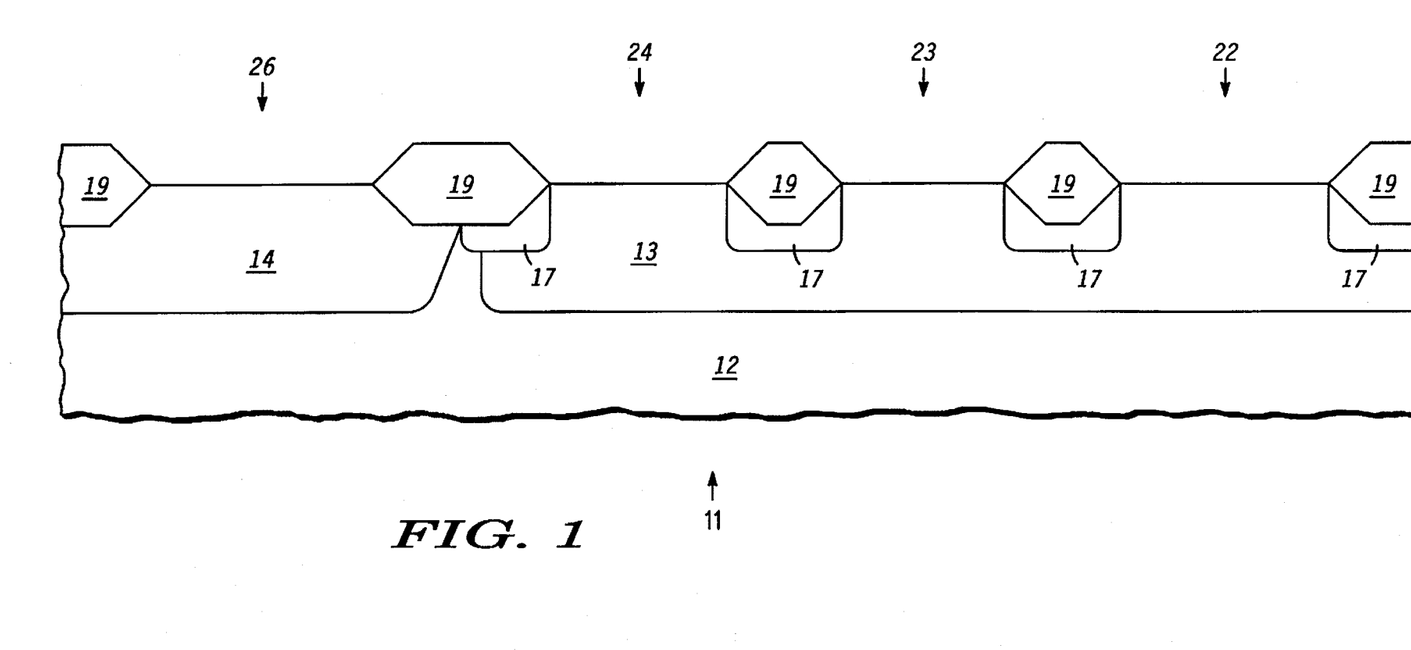
FIGS. 1–8 illustrate enlarged cross-sectional views of a semiconductor device at various stages of manufacture according to the present invention.

By way of example, the present invention can be more fully described with reference to FIGS. 1–8, which illustrate enlarged cross-sectional views of an example of a semiconductor device at various stages of fabrication according to the present invention. A simplified micro-controller device is used to illustrate the present invention. FIG. 1 shows a cross-section of a portion of a semiconductor device 11 including semiconductor wafer or substrate 12. Substrate 12 has a plurality of doped regions including well or doped region 13 extending from an upper surface of substrate 12, and well or doped region 14 extending from the upper surface. For purposes of this example, substrate 12 comprises a semiconductor material, such as silicon, and has a p-type conductivity. Well region 13 is a p-type conductivity p-type conductivity well and well region 14 is an n-type conductivity well. It is understood that the process according to the present invention is suitable for other conductivity type configurations.

Semiconductor device 11 further includes field regions 17, which in this example are p-type conductivity type regions, and isolation regions 19. Isolation regions 19 isolate well region 13 from well region 14. In addition, isolation regions 19 isolate regions 22, 23, and 24 from each other (regions 22, 23, and 24 are discussed below) within well region 13. Field regions 17 function to further isolate regions 22, 23, and 24. Methods for forming well region 13, well region 14, field regions 17, and isolation regions 19 are well known and include ion implantation, deposition, diffusion, oxidation, and photolithography techniques.

When semiconductor device 11 includes a programmable memory device such as an electrically erasable programmable read-only memory (EEPROM) device, substrate 12 is preferably of a <100> crystalline orientation and has a dopant concentration on the order of approximately $6\times10^{14}$ to $1\times10^{15}$ atoms/cm$^3$. Well region 13 has a surface concentration on the order of approximately $7.0\times10^{15}$ to $10\times10^{16}$ atoms/cm$^3$ and a junction depth on the order 2 to 4 microns. Well region 14 has a surface concentration on the order of approximately $1.0\times10^{16}$ to $2.0\times10^{16}$ atoms/cm$^3$ and a junction depth on the order of 3 to 5 microns. Isolation regions 19 have a thickness on the order of 6,000 to 9,000 angstroms.

In a micro-controller application, region 22 of semiconductor device 11 is suitable for the EEPROM portion of the device where transistor devices such as floating gate tunneling oxide transistor devices are fabricated. Region 23 is suitable for the read-only memory (ROM) portion of the device. Region 24 is suitable for the n-channel part of the static random-access memory (SRAM) portion and the central processing unit (CPU) portion of the micro-controller device. It is understood, that regions 23 and 24 are much larger than region 22 but are shown smaller so that the cross-section fits within FIG. 1. Region 26 is suitable for a complementary or remaining part of the CPU portion. Device structures and layouts for the SRAM portion, the ROM portion, the CPU portion, and the EEPROM portion are well known in the art.

Figure 2:
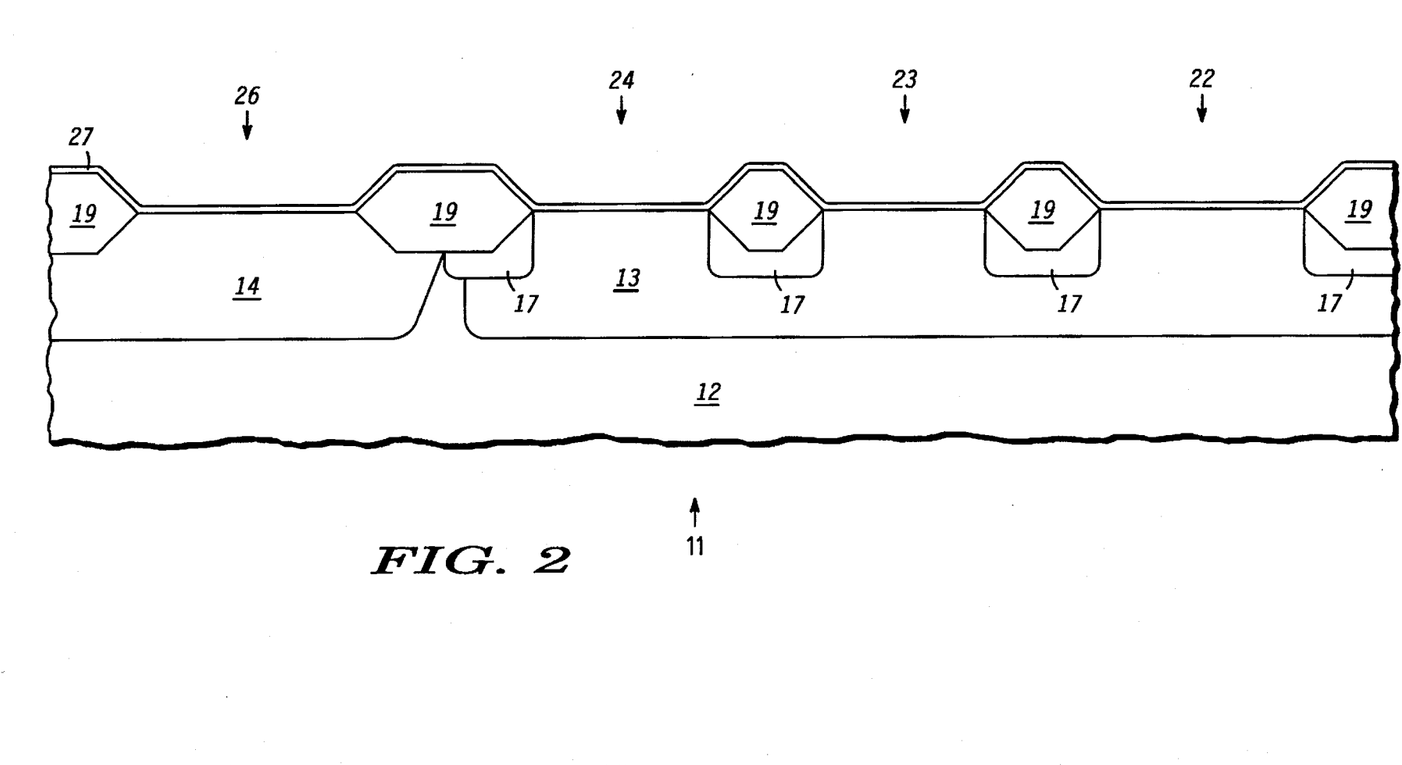

FIG. 2 shows semiconductor device 11 at a subsequent step of fabrication. A tunnel or thin oxide layer 27 is formed over isolation regions 19 and regions 22, 23, 24, and 26. Tunnel oxide layer 27 preferably has a thickness in a range from 80 to 120 angstroms and preferably is formed using dry O$_2$ and HCl/O$_2$ oxidation steps in combination with inert gas annealing steps. Such processes are well known in the art.

Figure 3:
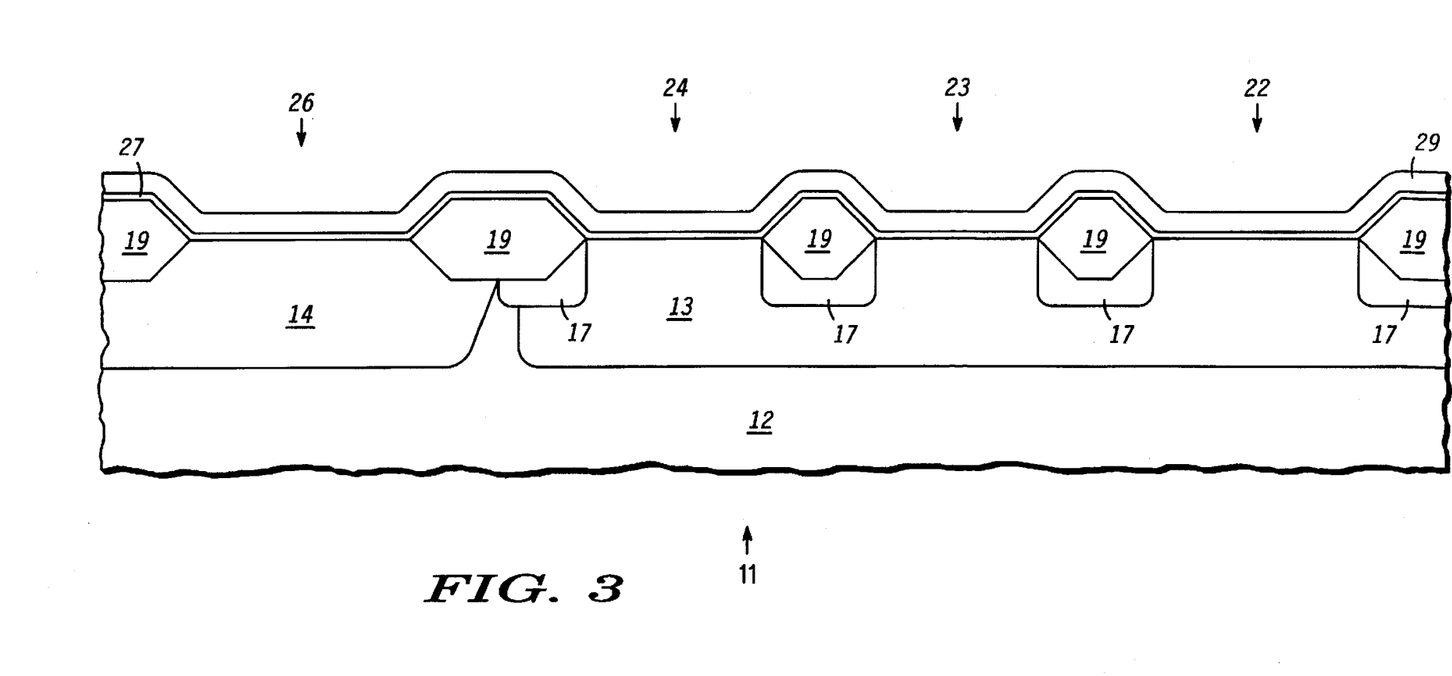

After tunnel oxide layer 27 is formed, polycrystalline semiconductor layer or floating gate layer 29 is formed over tunnel oxide layer 27 as shown in FIG. 3. Preferably, floating gate layer 29 is formed directly after tunnel oxide layer 27 is formed without intermediate processing, such as pre-diffusion clean processes. Preferably, floating gate layer 29 comprises a polysilicon layer and is formed using low-pressure chemical vapor deposition (LPCVD) techniques. Floating gate layer 29 has a thickness on the order of approximately 2,500 to 3,500 angstroms with a thickness on the order of approximately 2,700 to 2,800 angstroms preferred. Following deposition, floating gate layer 29 is doped to high dopant concentration with an n-type dopant using, for example, ion implantation/anneal or deposition/diffusion techniques. Floating gate layer 29 is preferably doped with phosphorous using a deposition/diffusion process with a phosphine ($PH_3$) source gas at approximately 900° C.

Figure 4:
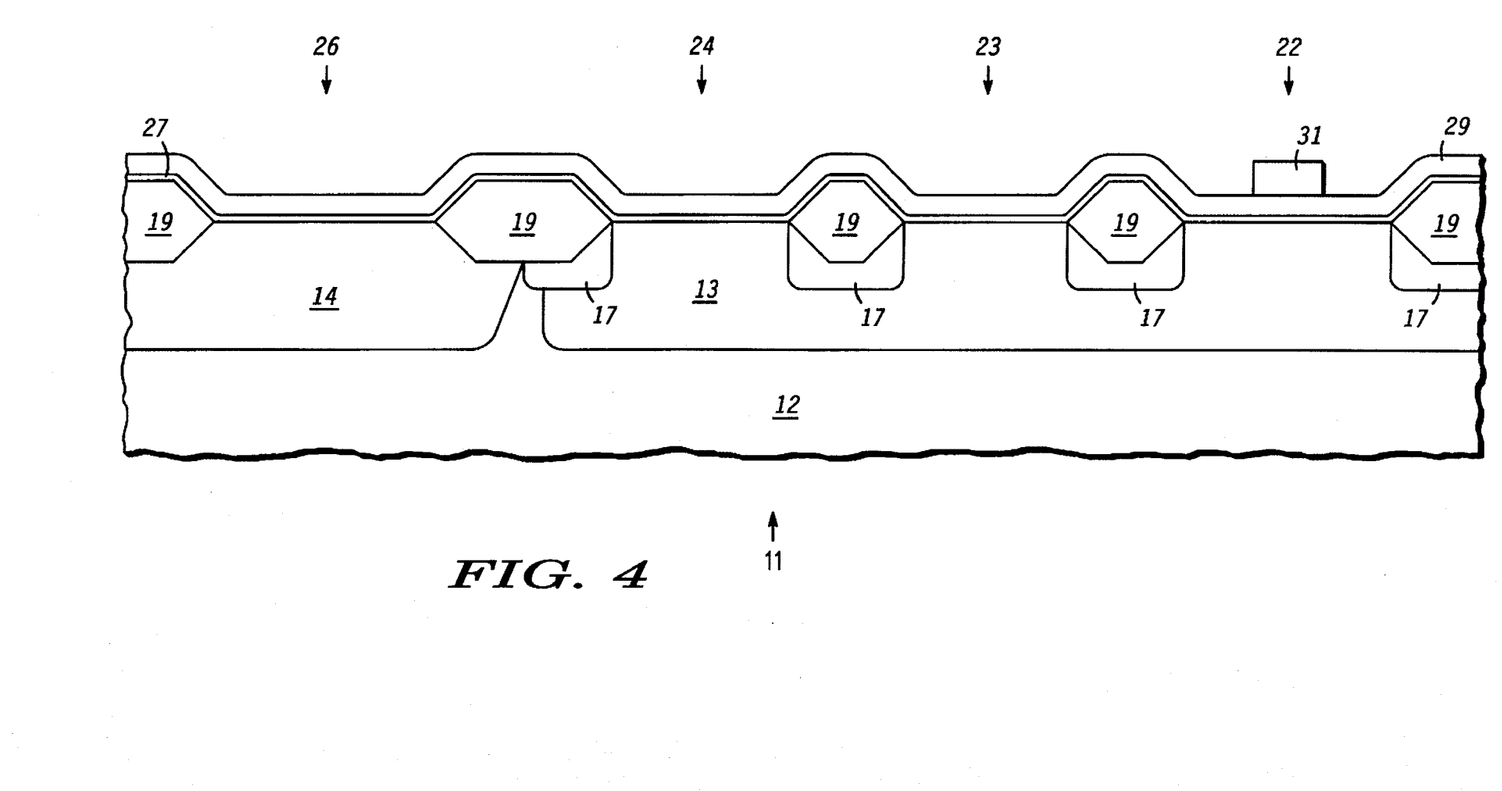

Following the doping process, floating gate layer 29 is patterned using conventional photolithography processing, such as photoresist deposition, cure, exposure, and develop processes. FIG. 4 shows semiconductor device 11 with patterned photoresist or protective layer 31 formed over a portion of floating gate layer 29. Once patterned photoresist layer 31 is formed, floating gate layer 29 is dry etched to form floating gate region 39 shown in FIG. 5. Preferably, floating gate layer 29 is etched using a plasma etching system, such as a LAM Auto Etch 490 Poly-Etcher available from LAM Research of Fremont, Calif. Preferably, a Chlorine/Helium etchant gas is used.

Figure 5:
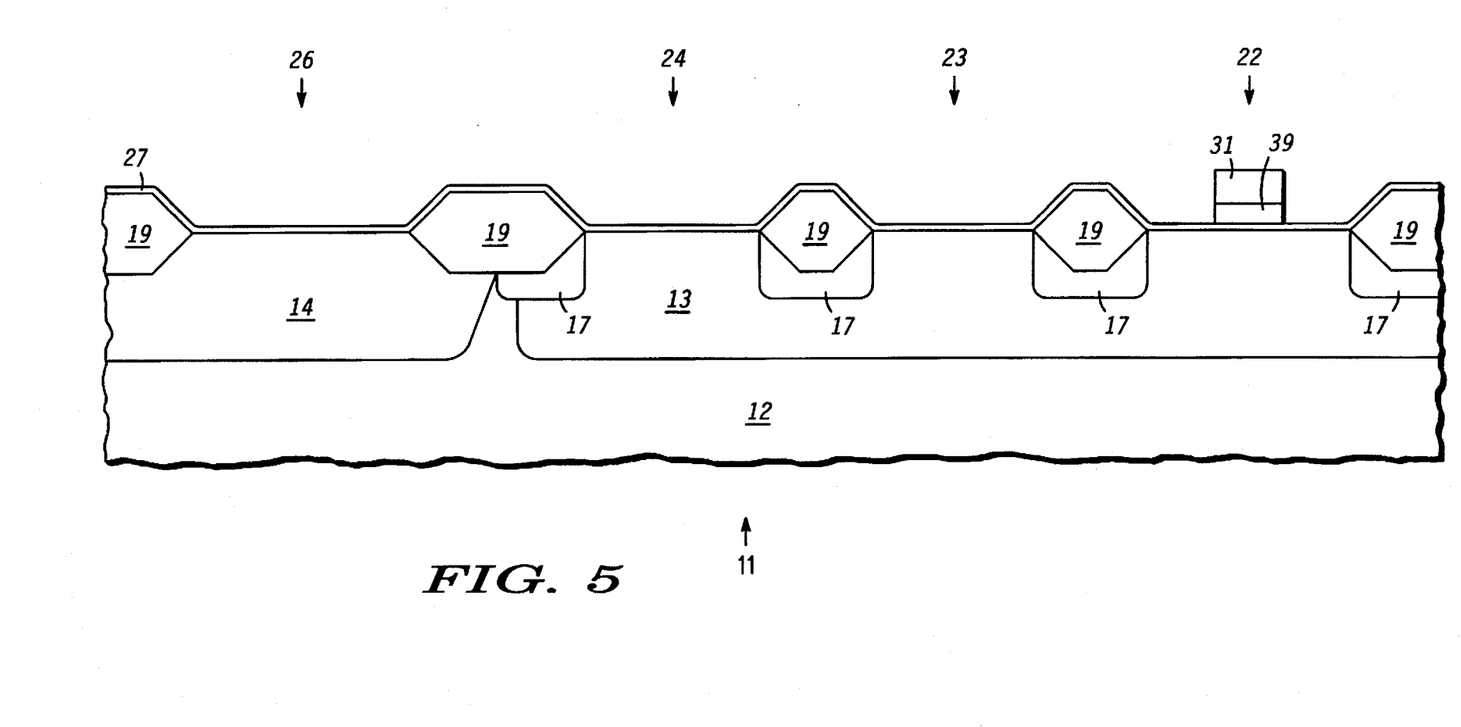

To minimize charge effects and/or surface damage, floating gate layer 29 preferably is etched using a pressure on an order of 400 milli-torr, a power on an order of 200 watts, an electrode spacing on an order of 0.5 centimeters (cm), a chlorine flow rate on an order of 130 sccm (standard cubic centimeters per minute), and a helium flow rate on an order of 110 sccm. After floating gate region 39 is formed, patterned photoresist layer 31 is removed using, for example, a plasma $O_2$ asher process followed by a piranha (sulfuric acid and hydrogen peroxide) clean. Preferably, substrate 12 is further cleaned in a standard ammonium hydroxide/hydrogen peroxide clean (typically referred to as an SC1 clean). Such processes are well known in the art.

Next, semiconductor substrate 12 is exposed to an elevated temperature or a heating or annealing process to anneal, reduce, or substantially eliminate any detrimental effects or defects (e.g., surface charge and/or damage) contiguous with the upper surface of semiconductor substrate 12 and/or tunnel oxide layer 27 caused by the dry etching process. Preferably, semiconductor substrate 12 is annealed at a temperature of approximately 630° to 670° C. for approximately 15 to 45 minutes in nitrogen or the like, with 30 minutes at 650° C. providing good results in finished product. It is understood that other anneal methods such as rapid thermal anneal (RTA) techniques are suitable.

Figure 6:
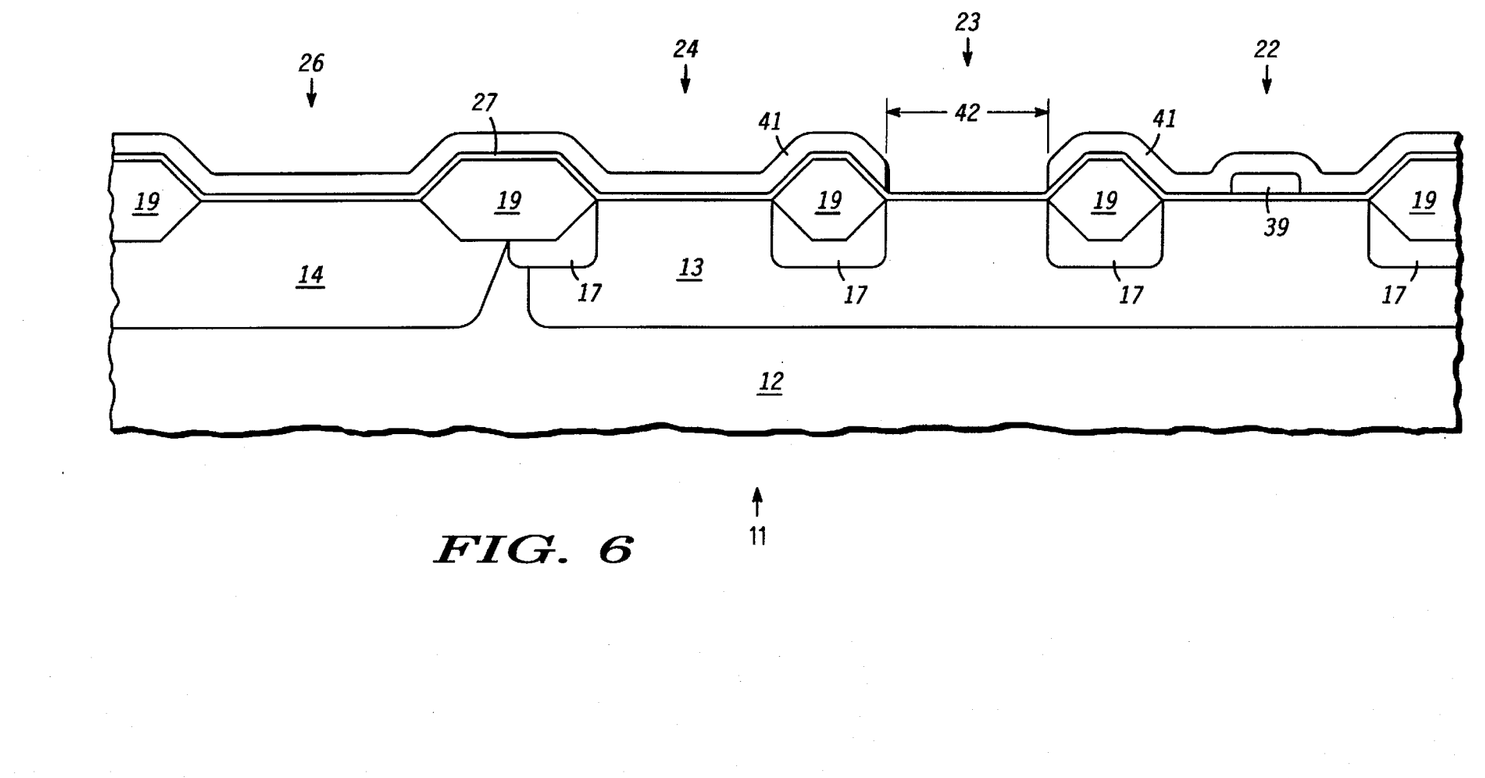

Following the anneal step, photoresist layer 41 is formed using well known techniques over the upper surface of tunnel oxide layer 27 and floating gate region 39 as shown in FIG. 6. Photoresist layer 41 is selectively patterned to provide openings such as opening 42 for selectively incorporating arsenic into region 23 of substrate 12. Only one opening 42 is shown, but it is understood that other openings exist where arsenic dopant is to be incorporated. In the present example, arsenic doped regions are used, among other things, to selectively program the ROM portion of the device.

Once photoresist layer 41 is selectively patterned, arsenic is incorporated or introduced into a select area or selected areas of substrate 12 to form n-type regions such as N+ extension or N+ region 44 (shown in FIG. 7) using well known doping techniques. Ion implantation is a preferred doping technique. Preferably, N+ region 44 is formed using arsenic implantation with an implant dosage on the order of 1.0 to $3.0 \times 10^{15}$ atoms/$cm^2$.

Figure 7:
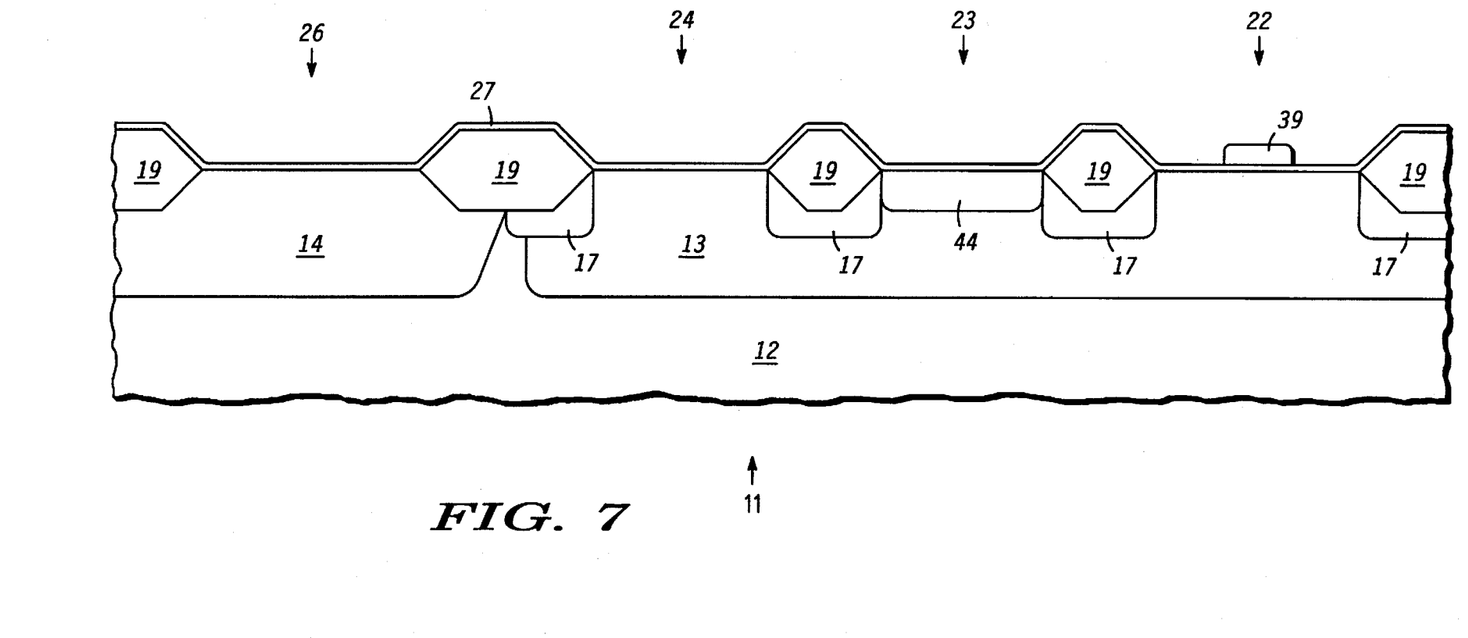

After N+ region 44 is formed, photoresist layer 41 is stripped using a photoresist removal process, such as the photoresist removal process described above to remove patterned photoresist layer 31, to provide the structure shown in FIG. 7. It was found that when arsenic doping techniques are used subsequent to dry etching techniques such as the plasma etching step used to pattern floating gate layer 29, the anneal process set-out above is necessary to avoid a shift in threshold voltage of MOSFET devices subsequently formed in regions 24 and 26. After extensive experimentation, it was found that the arsenic present in photoresist layer 41 (shown in FIG. 6) after arsenic doping interacts with any surface charge and/or damage present along tunnel oxide layer 27 and the upper surfaces of regions 24 and 26. This interaction results in a threshold voltage shift in both n-channel and p-channel devices subsequently fabricated in regions 24 and 26 respectively.

Also, it was found that once arsenic has interacted with the surface charge or damage, a subsequent pre-diffusion clean process (where tunnel oxide layer 27 is removed) and/or any subsequent high temperature processing (e.g., a gate oxidation process) do/does not eliminate the threshold voltage shift problem. To avoid the threshold voltage shift, the anneal step preferably is done immediately following the dry etching of floating gate layer 29.

In previous generations of larger geometry micro-controller devices (approximately 2 micron geometry), phosphorous typically is used instead of arsenic to selectively program the ROM portion of the device. The threshold voltage shift problem is not apparent in the larger geometry devices doped with phosphorous. Thus, an anneal process is not used in the manufacture of larger geometry devices using phosphorous doping after the formation of the floating gate region. However, with smaller geometry devices (approximately 1.6 micron geometry), arsenic is a preferred dopant for particular regions of the device in order to reduce parasitic capacitances. With the process according to the present invention, smaller geometry arsenic doped micro-controller devices having enhanced reliability are achieved.

Figure 8:
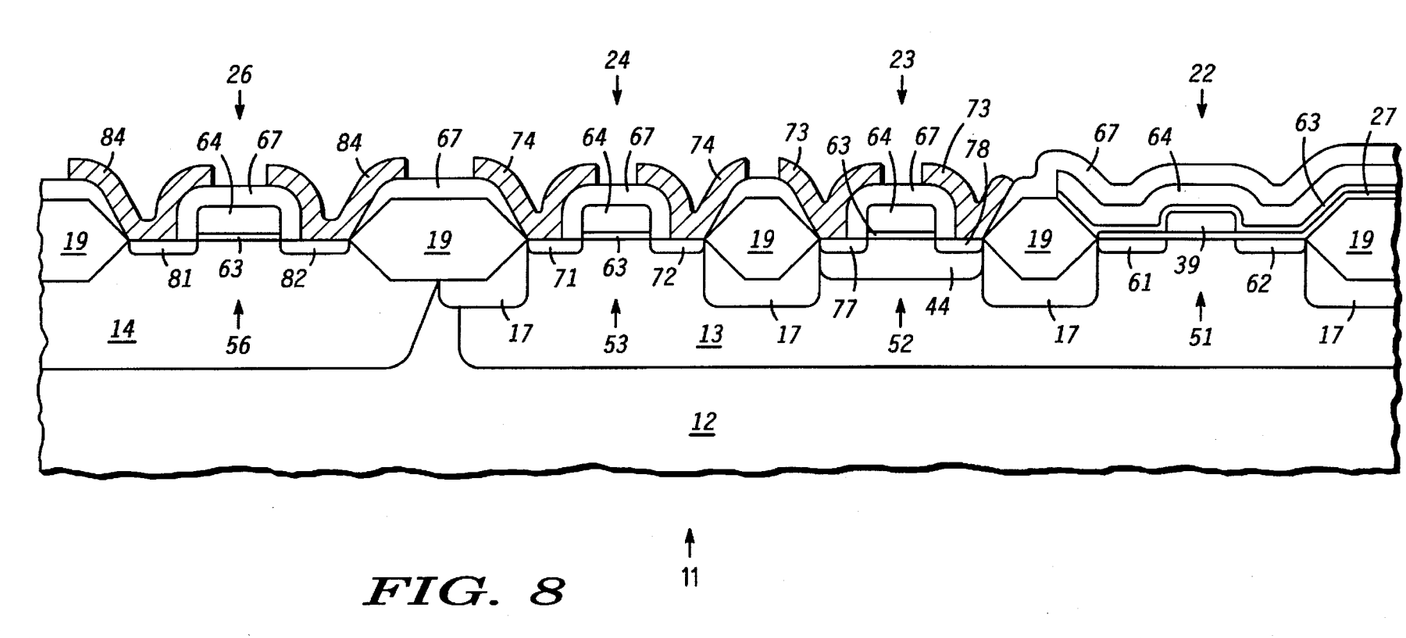

FIG. 8 illustrates a cross-sectional view of semiconductor device 11 at a later fabrication step after the formation of surface sensitive devices including n-channel device 53 and p-channel device 56. Well region 13 is shown with floating gate device 51, ROM device 52, and n-channel device 53. Floating gate device 51 includes first extension region 61, second extension region 62, tunnel oxide layer 27, floating gate region 39, thin oxide 63, doped polysilicon region 64, and passivation layer 67. ROM device 52 includes N+ region 44, source region 77, drain region 78, thin oxide 63, doped polysilicon region 64, passivation layer 67, and ohmic contacts 73. N-channel device 53 includes source region 71, drain region 72, thin oxide 63, doped polysilicon region 64, passivation layer 67, and ohmic contacts 74. Well region 14 is shown with p-channel device 56, which includes source region 81, drain region 82, thin oxide 63, doped polysilicon region 64, passivation layer 67, and ohmic contacts 84.

In a preferred embodiment for semiconductor device 11, first extension region 61 and second extension region 62 comprise phosphorous doped regions formed using phosphorous ion implantation with an implant dose on the order of 1.0 to $5.0 \times 10^{14}$ atoms/$cm^2$. Thin oxide 63 has thickness on the order of 275 to 425 angstroms and is formed using a wet oxidation process. Doped polysilicon region 64 is formed using an LPCVD process and is doped with phosphorous using a PH$_3$ deposition/diffusion process. Doped polysilicon region 64 has thickness on the order of 2,500 to 4,000 angstroms. Source regions 71 and 77 and drain regions 72 and 78 comprise an n-type dopant and preferably are formed using a two step doping process such as a two step ion implantation process including a first implant of arsenic on the order of $1.0 \times 10^{15}$ to $1.0 \times 10^{16}$ atoms/cm$^2$ followed by a second implant of phosphorous on the order of $1.0 \times 10^{13}$ to $1.0 \times 10^{14}$ atoms/cm$^2$. Source region 81 and drain region 82 comprise a p-type dopant and preferably are formed using boron ion implantation with a dose on the order of $1.0 \times 10^{15}$ to $1.0 \times 10^{16}$ atoms/cm$^2$. Passivation layer 67 preferably comprises a doped passivation layer such boro-phospho-silicate glass (BPSG) or the like, and has a thickness on the order of 6,000 to 8,000 angstroms. Preferably, a first portion of passivation layer 67 is undoped and the remaining portion is doped. Ohmic contacts 73, 74 and 84 preferably comprise a metal including aluminum such as an aluminum-silicon-copper alloy, have a thickness on the order of 6,000 to 9,000 angstroms, and are formed using well-known sputtering or evaporating techniques.

With a process according to the present invention, surface sensitive devices such as n-channel device 53 and p-channel device 56 exhibit stable electrical characteristics (e.g., stable threshold voltage). Although a micro-controller structure has been shown as an example of a semiconductor device using the process according to the present invention, it is understood that the process according to the present invention is suitable for any semiconductor device using dry etching techniques together with arsenic doping in applications where surface sensitive devices are fabricated. The method is particularly suitable for surface sensitive devices such as MOSFET devices where stable threshold voltages are important.

By now it should be appreciated that there has been provided a method for fabricating a stable arsenic doped semiconductor device where dry etching processes are used. By annealing a semiconductor substrate after dry etching and before arsenic dopant incorporation, devices having stable electrical characteristics are achieved. The method supports the fabrication of smaller geometry micro-controller designs using arsenic as a dopant species to provide an semiconductor device having stable MOSFET threshold voltage characteristics.

We claim:

1. A method for manufacturing a stable arsenic doped semiconductor device comprising the steps of:
   providing a semiconductor substrate having a plurality of doped regions;
   forming a thin oxide layer over the semiconductor substrate;
   forming a polycrystalline semiconductor layer over the thin oxide layer;
   patterning the polycrystalline semiconductor layer using a dry etch system;
   annealing the semiconductor substrate at approximately 630° C. to 670° C. after the patterning step to reduce any detrimental effects caused by the dry etch system;
   selectively incorporating arsenic into the semiconductor substrate after the annealing step; and
   forming a surface sensitive device in one of the plurality of doped regions, the surface sensitive device having stable electrical characteristics.

2. The method of claim 1 wherein the step of forming the polycrystalline semiconductor layer includes forming a polysilicon layer.

3. The method of claim 2 wherein the step of patterning the polycrystalline semiconductor layer includes etching the polycrystalline semiconductor layer in the dry etch system, wherein the etching step includes etching the polycrystalline semiconductor layer while the dry etch system has a pressure of about 400 milli-torr, a power setting of about 200 watts, an electrode spacing of about 0.5 cm, a chlorine flow rate of about 130 sccm, and a helium flow rate of about 110 sccm.

4. The method of claim 1 wherein the step of incorporating arsenic includes ion implanting the arsenic.

5. The method of claim 1 wherein the step of annealing semiconductor substrate includes annealing the semiconductor substrate for approximately 15 to 45 minutes in nitrogen.

6. The method of claim 1 wherein the step of forming a surface sensitive device includes forming a MOSFET device.

7. A process for forming an arsenic doped semiconductor integrated circuit device comprising the steps of:
   forming an oxide layer on an upper surface of a substrate, the substrate comprising a semiconductor material of a first conductivity type and having a first doped region of the first conductivity type extending from the upper surface and a second doped region of a second conductivity type extending from the upper surface;
   forming a polysilicon layer on the oxide layer;
   patterning the polysilicon layer in a dry etch system;
   annealing the substrate after the patterning step;
   doping the substrate with arsenic after annealing the substrate; and
   forming a MOSFET device in one of the first doped region and the second doped region.

8. The process according to claim 7 wherein the step of patterning the polysilicon layer includes etching the polysilicon layer in a plasma etch system having a pressure of about 400 milli-torr, a power setting of about 200 watts, an electrode spacing of about 0.5 cm, a chlorine flow rate of about 130 sccm, and a helium flow rate of about 110 sccm.

9. The process according to claim 7 wherein the step of annealing the substrate includes heating the substrate at temperature of approximately 630° C. to 670° C. for approximately 15 to 45 minutes.

10. The process according to claim 9 wherein the step of annealing the substrate includes exposing the substrate to approximately 650° C. for 30 minutes in nitrogen.

11. The process according to claim 7 wherein the step of doping the substrate includes ion implanting the arsenic into selected areas of the first doped region.

12. The process according to claim 11 wherein the step of doping the substrate includes ion implanting the arsenic at a dosage of about $1.0 \times 10^{15}$ to $3.0 \times 10^{15}$ atoms/cm$^2$.

13. Process according to claim 7 wherein the step of forming the oxide layer includes forming the oxide layer having a thickness in a range from 80 to 120 angstroms.

14. A method for forming semiconductor device comprising the steps of:
   providing a substrate of a first conductivity type, the substrate having a first well region of the first conductivity type extending from an upper surface of the substrate and a second well region of a second conductivity type extending from the upper surface;
   forming a tunnel oxide layer on the upper surface;
   forming a floating gate layer on the tunnel oxide layer;
   patterning the floating gate layer to form a floating gate region over a portion of the first well region, wherein the patterning includes dry etching the floating gate layer;

annealing the substrate after the patterning step in a non-oxidizing environment;

introducing arsenic into selected areas of the first well region to form a ROM portion of the semiconductor device after the step of annealing the substrate; and forming a first MOSFET device in the first well region and a second MOSFET device in the second well region.

15. The method of claim 14 wherein the step of forming the floating gate layer includes forming a polysilicon layer having an n-type conductivity and a thickness of about 2,500 to 3,500 angstroms.

16. The method of claim 15 wherein the step of patterning the floating gate layer includes the dry etching the floating gate layer in a dry etch system having a chlorine flow rate of about 130 sccm, and a helium flow rate of about 110 sccm.

17. The method of claim 14 wherein the step of forming the tunnel oxide layer includes forming the tunnel oxide layer having a thickness in a range from 80 to 120 angstroms.

18. The method of claim 14 wherein the step of annealing includes exposing the substrate to a temperature of approximately 630° C. to 670° C. for approximately 15 to 45 minutes in nitrogen.

19. The method of claim 14 wherein the step of introducing arsenic includes ion implanting the arsenic at an implant dosage of about $1.0 \times 10^{15}$ to $3.0 \times 10^{15}$ atoms/cm$^2$.

* * * * *